United States Patent
Bourez

(10) Patent No.: US 8,399,809 B1
(45) Date of Patent: Mar. 19, 2013

(54) LOAD CHAMBER WITH HEATER FOR A DISK SPUTTERING SYSTEM

(75) Inventor: Allen J. Bourez, San Jose, CA (US)

(73) Assignee: WD Media, Inc., San Jose, CA (US)

( * ) Notice: Subject to any disclaimer, the term of this patent is extended or adjusted under 35 U.S.C. 154(b) by 346 days.

(21) Appl. No.: 12/652,709

(22) Filed: Jan. 5, 2010

(51) Int. Cl.
*F27D 5/00* (2006.01)

(52) U.S. Cl. ........................................ 219/388; 219/392

(58) Field of Classification Search ................... 219/392, 219/388
See application file for complete search history.

(56) References Cited

U.S. PATENT DOCUMENTS

| | | | |
|---|---|---|---|
| 5,331,134 A * | 7/1994 | Kimura | 219/543 |
| 5,509,771 A * | 4/1996 | Hiroki | 414/217 |
| 5,693,199 A | 12/1997 | Bourez et al. | |
| 5,925,227 A | 7/1999 | Kobayashi et al. | |
| 6,455,101 B1 | 9/2002 | Sasaki et al. | |
| 7,182,122 B2 | 2/2007 | Koguchi et al. | |
| 7,427,571 B2 * | 9/2008 | Lindeboom et al. | 438/758 |
| 8,354,618 B1 | 1/2013 | Chen et al. | |
| 2009/0151634 A1 | 6/2009 | Watanabe et al. | |

OTHER PUBLICATIONS

MDP-250B Disk Sputtering System Operator's Manual, Apr. 9, 1996; Vaccuum Systems Divsion Intevac, Inc.*

MDP-250B Disk Sputtering System Operator's Manual, Intevac, Inc., Apr. 9, 1996. 168 pages.

* cited by examiner

*Primary Examiner* — Chuong A Luu
*Assistant Examiner* — Robert Bachner

(57) ABSTRACT

A disk processing system having a plurality of processing chambers, a load chamber comprising a heater, and a disk transport system coupled to the plurality of processing chambers and the load chamber to transport a disk there among.

18 Claims, 8 Drawing Sheets

LOAD CHAMBER WITH HEATER FOR A DISK SPUTTERING SYSTEM

TECHNICAL FIELD

Embodiments described herein relate to the field of disk processing systems, and, in particularly, to a disk processing system having a load chamber heater.

BACKGROUND

Various processing systems are used in the fabrication of magnetic recording disks. One such processing system is the Intevac MDP-250B disk sputtering system, available from Intevac, Inc. of Santa Clara, Calif. The Intevac MDP-250B disk sputtering system is a production disk coating system designed to automatically sputter thin films of magnetic material and supplementary materials onto disks for magnetic information storage.

The Intevac MDP-250B disk sputtering system has 12 isolated process chambers, as illustrated in FIG. 1. The first process chamber is typically an infrared heater station that has quartz lamps positioned on each side of a disk. The remaining 11 process chambers are thin film deposition chambers or a combination of thin film deposition chambers and special purpose stations. The special purpose stations that may be selected are DC etch stations for cleaning disks, heating stations, and cooling stations to provide temperature control for optimum coating conditions.

BRIEF DESCRIPTION OF THE DRAWINGS

The present invention is illustrated by way of example, and not limitation, in the figures of the accompanying drawings in which.

DETAILED DESCRIPTION

Embodiments of a method are described herein with reference to figures. However, particular embodiments may be practiced without one or more of these specific details, or in combination with other known methods, materials, and apparatuses. In the following description, numerous specific details are set forth, such as specific materials, dimensions and processes parameters etc. to provide a thorough understanding. In other instances, well-known manufacturing processes and equipment have not been described in particular detail to avoid unnecessarily obscuring the claimed subject matter. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment. Furthermore, the particular features, structures, materials, or characteristics may be combined in any suitable manner in one or more embodiments.

Embodiments of a disk processing system having a load chamber heater are described. The disk processing system includes a plurality of processing chambers, a load chamber having a heater, and a disk transport system coupled to the plurality of processing chambers and the load chamber to transport a disk there among. In one embodiment, the load chamber also includes a cooling assembly that may be disposed within a cover of the load chamber. The heater is disposed adjacent to a side wall inside of the load chamber. In one embodiment, the heater may have a pyrolytic boron nitride heating element. The load chamber also includes a load arm assembly to move the disk through the chamber to be adjacent to the heater. The load arm assembly is constructed from high temperature materials, such as ceramic, stainless steel, titanium and nickel steel alloy. The cover of the load chamber may also include a disk presence sensor that is oriented towards a side edge of the disk when the disk is secured in the load arm and adjacent to the heater.

Figure 1:
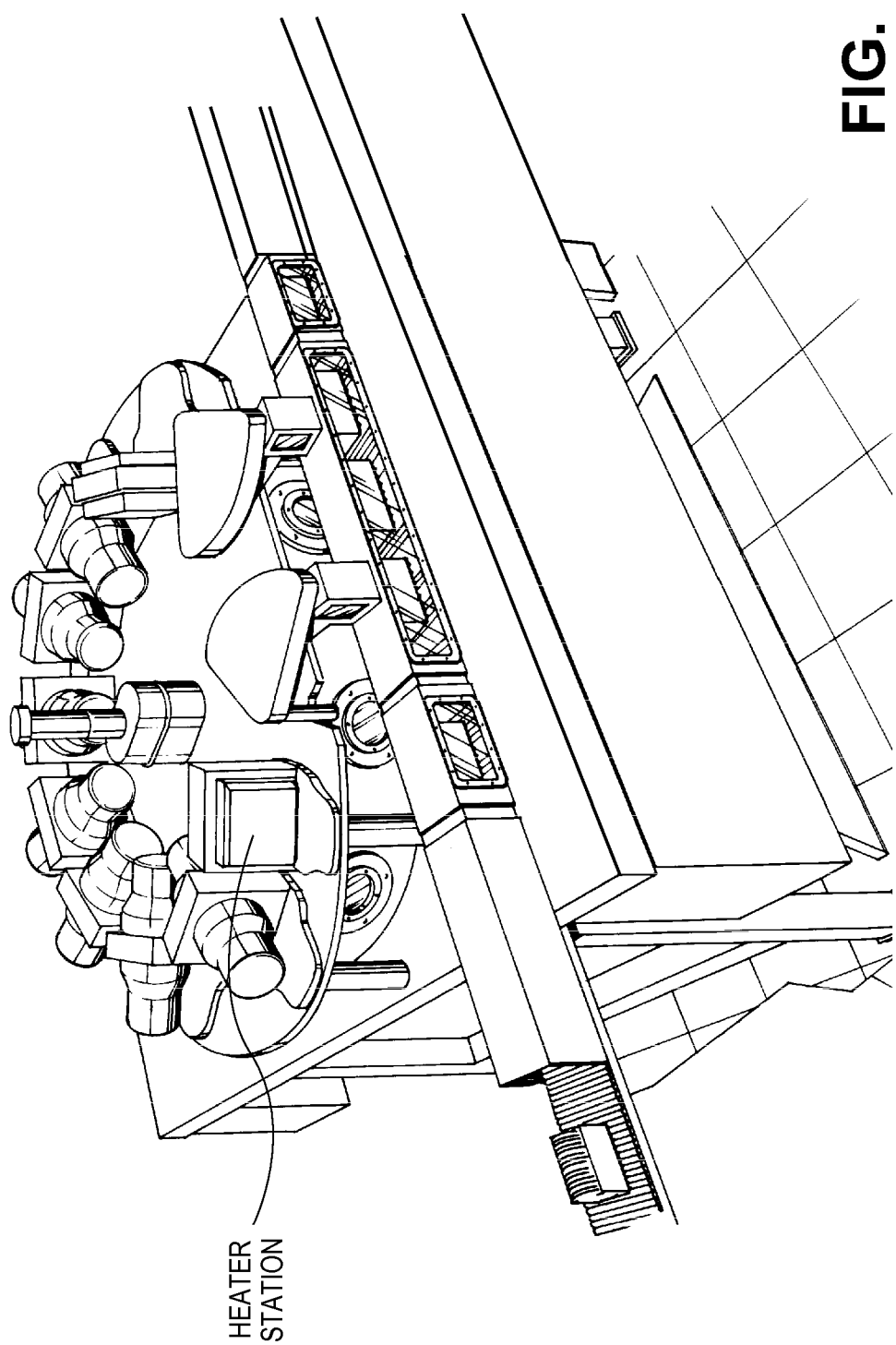
FIG. 1 illustrates a conventional Intevac MDP-250B disk sputtering system.
Figure 2:
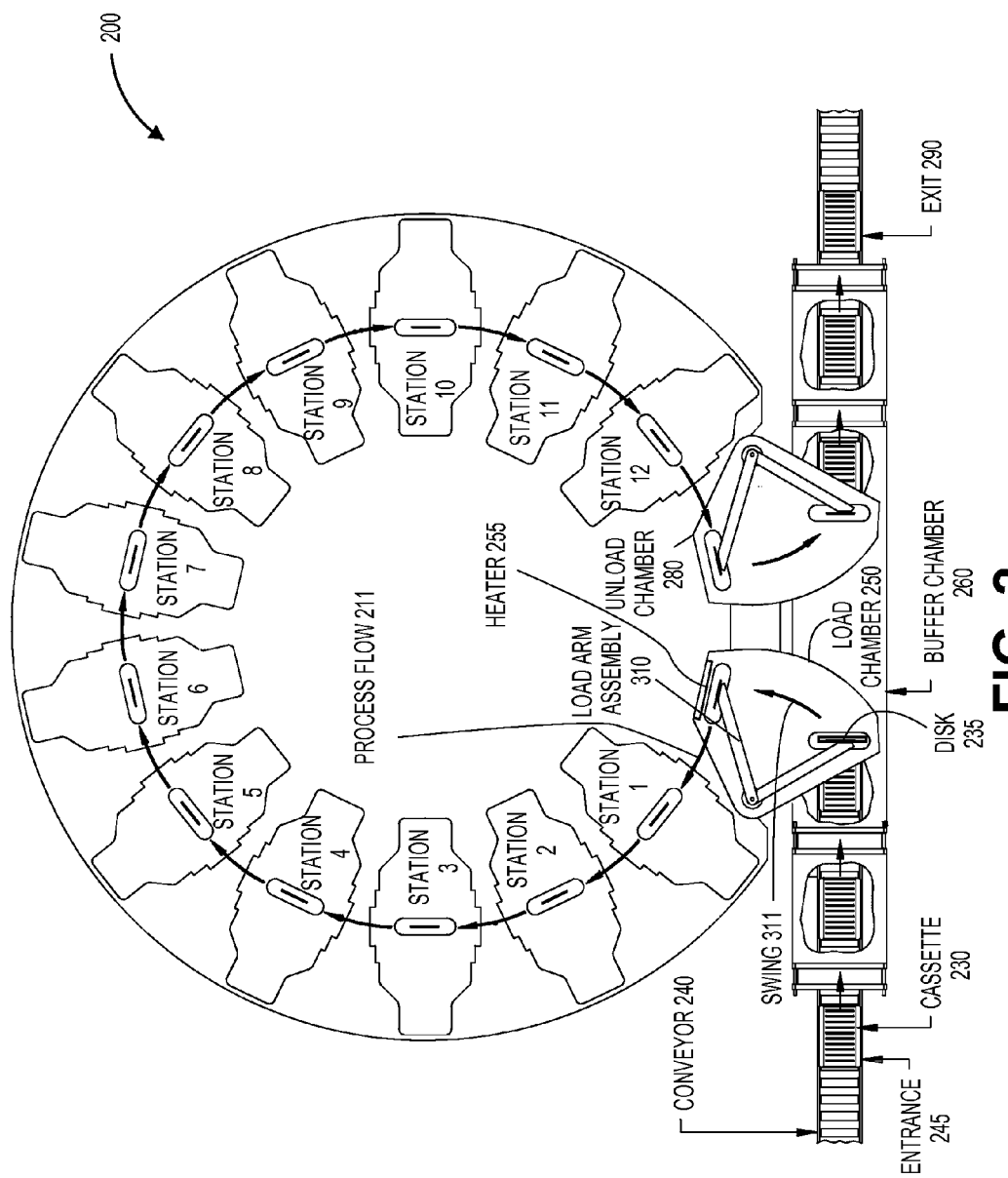
FIG. 2 illustrates a disk processing system having a load chamber heater according to one embodiment of the present invention.

FIG. 2 illustrates a disk processing system having a load chamber heater according to one embodiment of the present invention. Disk processing system 200 includes a plurality of processing chambers situated at stations 1-12 around the system, that are used to automatically coat material onto disks for magnetic information storage. Although twelve stations are illustrated in FIG. 2, the disk processing system 200 may have more or less than 12 stations in alternative embodiments. Any type of processing chamber may be mounted at any of the stations, for example, but not limited to sputter, chemical vapor deposition (CVD), etching, cooling, heating, etc. However, in one particular embodiment, none of the (e.g., 12) processing chambers contains a heater, such that disk processing system 200 only contains a heater 255 within the load chamber 250. Alternatively, one or more of the processing chambers may include a heater or have heat introduced (e.g., through heating conduits). A disk transport system disposed beneath the stations transports the disk 235 in a process flow 211 among the various stations, with some stations being skipped in certain embodiments. In one embodiment, the disk transport system includes a carousel having a pedestal to secure a disk. The carousel transports the disk among the stations. The carousel moves in at least two planes: vertically to move a disk inside and outside of a process chamber, and horizontally to position a pedestal under a process chamber. In one embodiment, the disk transport system of the Intevac MDP-250B disk sputtering system is used. Disk transport systems, such as used in the Intevac MDP-250B disk sputtering system, are known in the art; accordingly, further details are not provided herein.

Where an existing Intevac MDP-250B disk sputtering system is modified to have a load chamber 250 with a heater 255 in accordance with embodiments described below, then one of other stations of the system need not be used as a heater station and, instead, may be used as another processing chamber (e.g., a thin film deposition chamber). In one particular embodiment, one of the freed processing chambers (e.g., at station 6) may be used to sputter a grain isolation layer.

A cassette 230 of unprocessed disks (e.g., disk 235) is placed on the conveyer 240 at the entrance 245 of the system 200. The cassette 230 proceeds through several gates until it is conveyed to a buffer chamber 260. From the buffer chamber 260, disks from the cassette 230 are individually transferred into a load chamber 250 by a lift blade 353 (shown in FIG. 3B) to the load arm assembly 310 of the load chamber 250. The load arm assembly 310 takes the disk 235 from lift blade 353 and swings 311 the disk 235 into position adjacent to a heater 255 in the load chamber 250 for heating, as discussed in further detail below. When the heating operation is completed, the disk 235 is transferred onto a carousel pedestal for transport to a processing chamber at the first active station (e.g., station 1). Disks may be continuously loaded into the system 200, transported and processed simultaneously in all of the active processing stations. After a disk 235 has been rotated though all the processing stations, it is moved into the unload chamber 280 for unloading into an unload cassette. The unload cassette proceeds through gates to exit 290 on the conveyer 240.

Figure 3A:
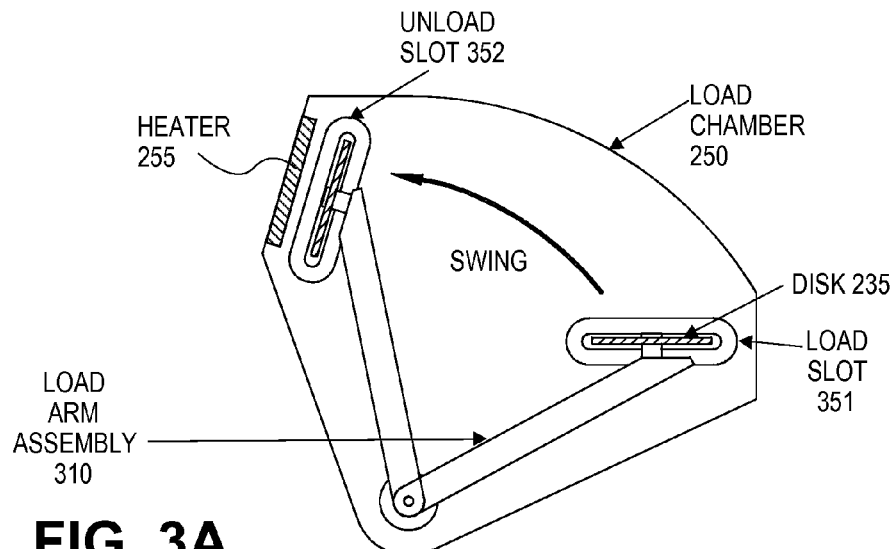
FIG. 3A is a top view, conceptually illustrating a load chamber (with a cover removed) according to one embodiment of the present invention.
Figure 3B:
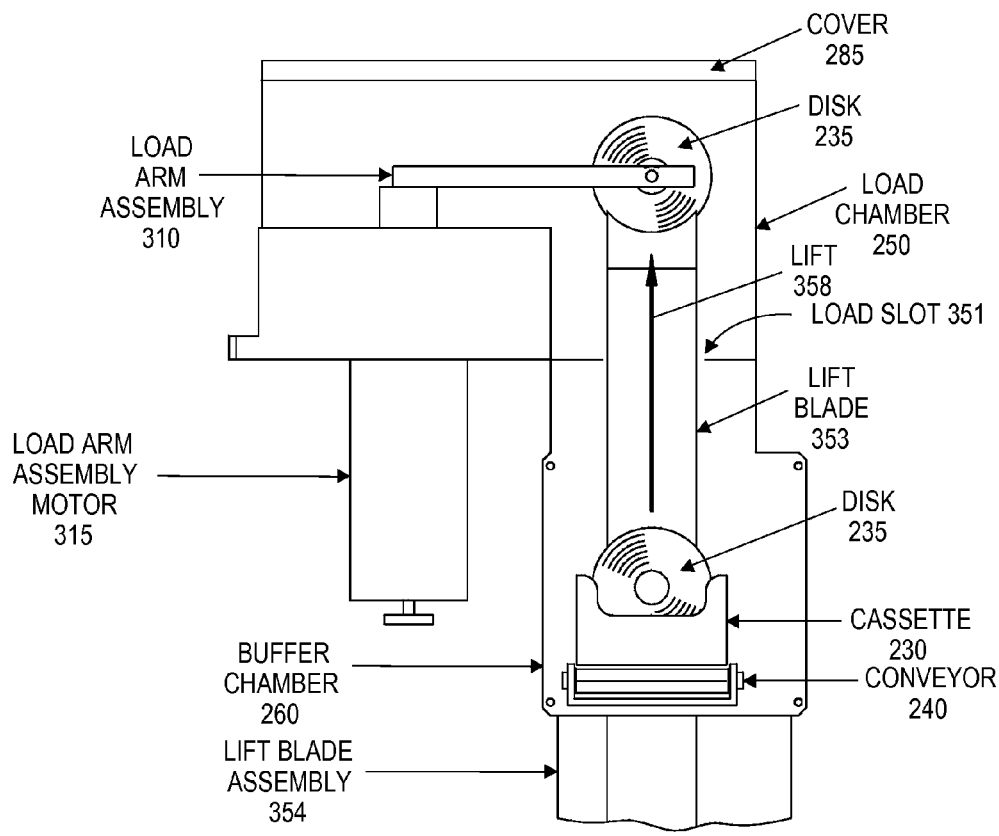
FIG. 3B is a cross sectional view of the load chamber of FIG. 3A with the load arm assembly at the disk load position.

FIG. 3A is a top view, conceptually illustrating a load chamber (with a cover removed) according to one embodiment of the present invention. FIG. 3B is a cross sectional view of the load chamber of FIG. 3A with the load arm assembly at the disk load position. After the conveyer 240 positions cassette 230 into position under the load chamber 250, a lift blade 353 of a lift blade assembly 354 lifts 358 a disk 235 through a load slot 351 to load the disk 235 onto the lift arm assembly 310. A load arm assembly motor 315 is then used to swing the load arm assembly 310 to the other side of the load chamber 250 and position the disk 235 adjacent heater 255. The load arm assembly 310 maintains the disk 235 in this position while the heater 255 is active in order to heat the disk 235 to a desired temperature for a desired time. After a certain amount of time, an unload lift blade 852 (shown in FIG. 8) rises through the unload slot 352 and transfers the disk 235 to a carousel pedestal of the disk transportation system located beneath the load chamber 250, according to one embodiment. In one exemplary embodiment, the disk 235 is maintained adjacent heater 255 for heating for less than 4 seconds (e.g., approximately 3.8 seconds) with a power greater than 1.1 K Watts (e.g., approximately 2.5 K Watts).

It should be noted in the heater 255 may not necessarily be coupled to a side wall of the load chamber 250 as appears in the conceptual illustration of FIG. 2A. The heater 255 may be coupled within the load chamber 250 in various different manners (e.g., to a cover of the load chamber), as discussed in more detail below.

Figure 4:
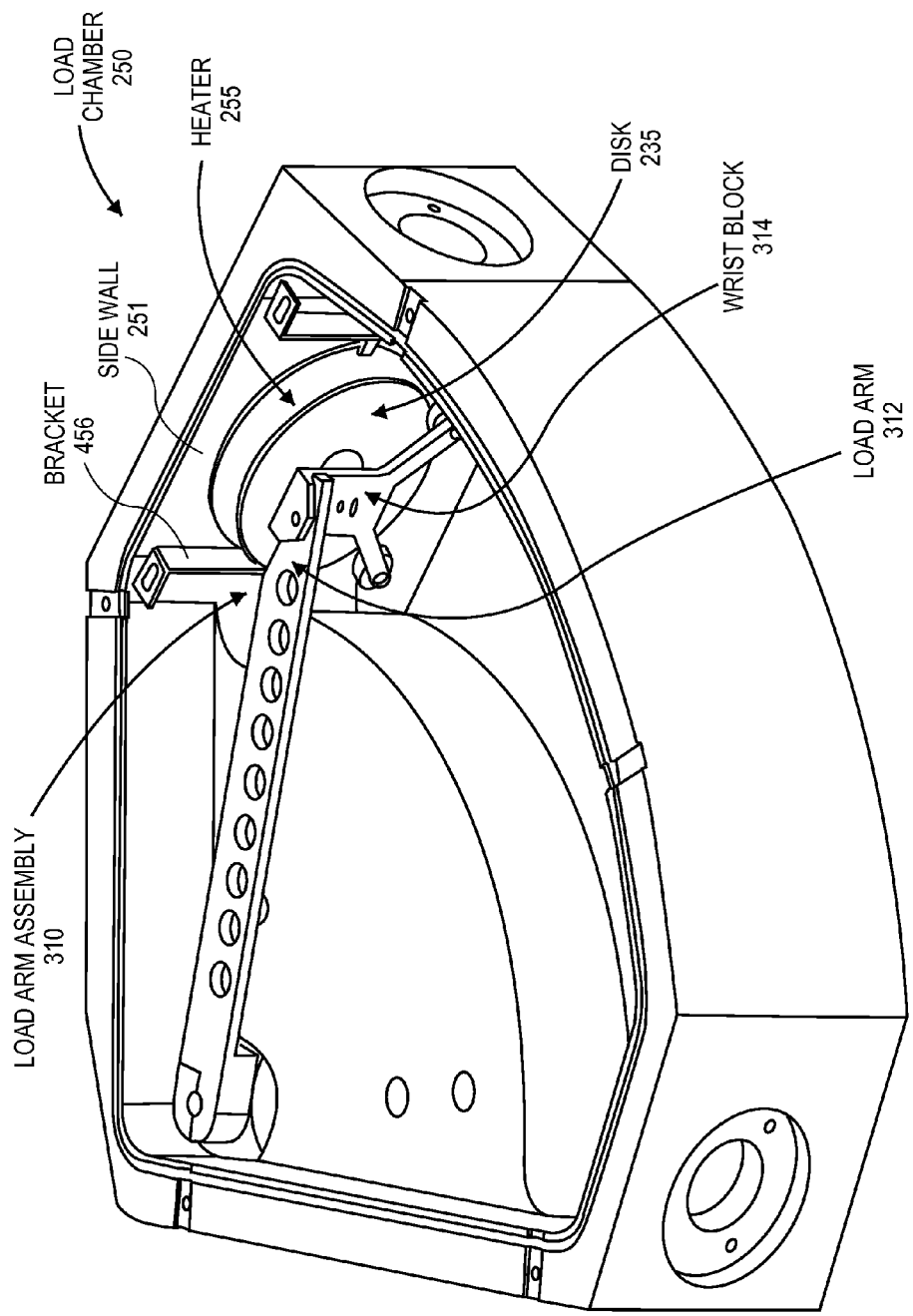
FIG. 4 is an perspective view providing a more detailed illustration of a load chamber having a heater, according to one embodiment of the present invention.
Figure 8:
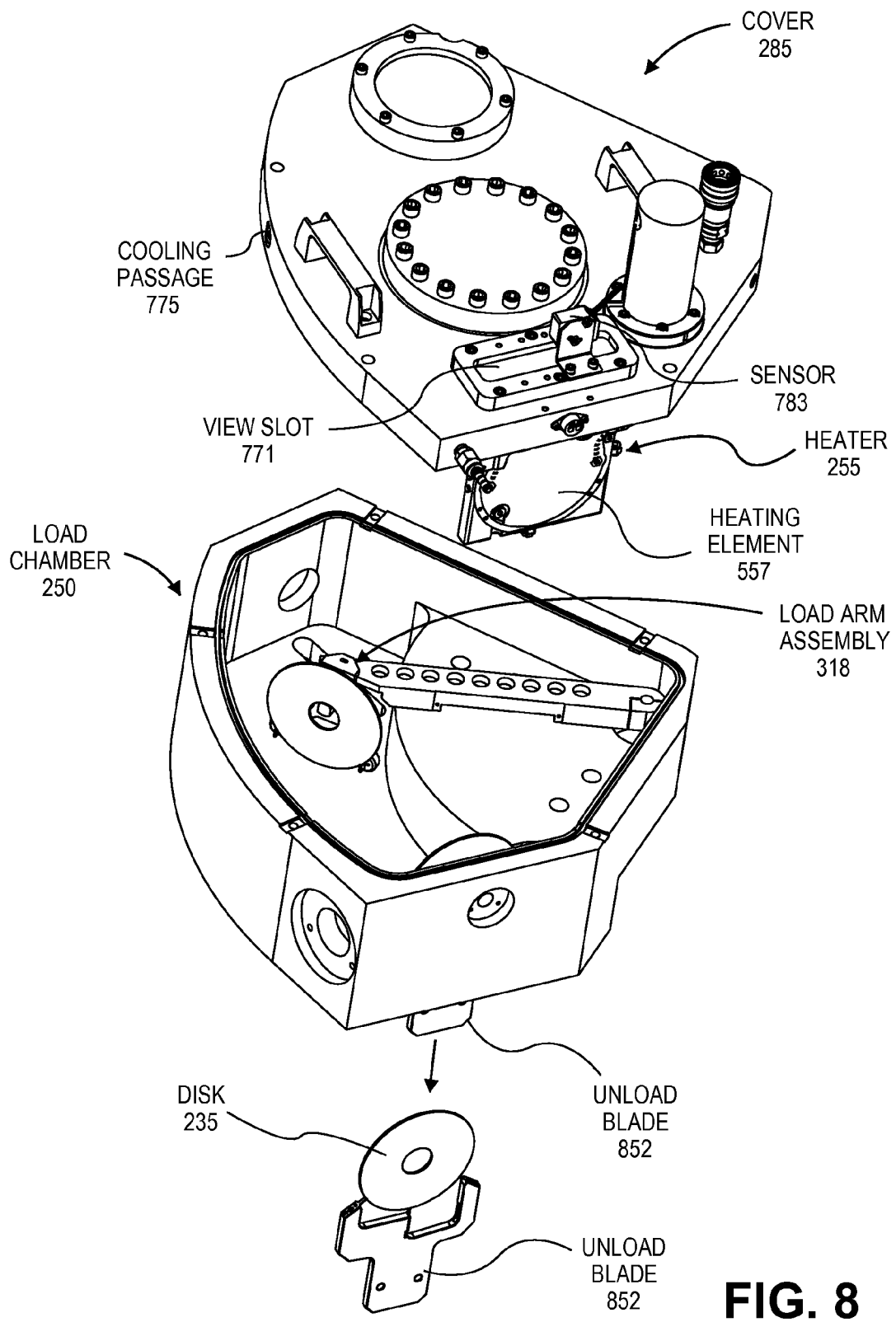
FIG. 8 is an exploded view illustrating one embodiment of a load chamber in relation to a lift arm.

FIG. 4 is an perspective view providing a more detailed illustration of a load chamber having a heater, according to one embodiment of the present invention. As with the conceptual illustration of the FIG. 3A, the load chamber 250 is shown in FIG. 4 with cover 285 removed in order to show details of the components within the load chamber 250. In the illustration of FIG. 4, the load arm assembly 310 is shown in a second position where the disk 235 is maintained adjacent to heater 255. The heater 255 is situated in the load chamber 250 in the space between the unload slot 352 and the side wall 251 of the load chamber 250. In this embodiment, only a single heater is used to heat the disk 235. The heating element of the heater 255 is approximately sized (e.g. diameter) to cover the surface of the disk 235 but, alternatively, may be sized smaller or larger than the disk to be heated. In this embodiment, the heater 255 is mounted within a bracket 456 that is coupled to cover 285 (as shown in FIG. 8). Components of the heater 255 are more readily seen from an inspection of FIG. 5.

Figure 5:
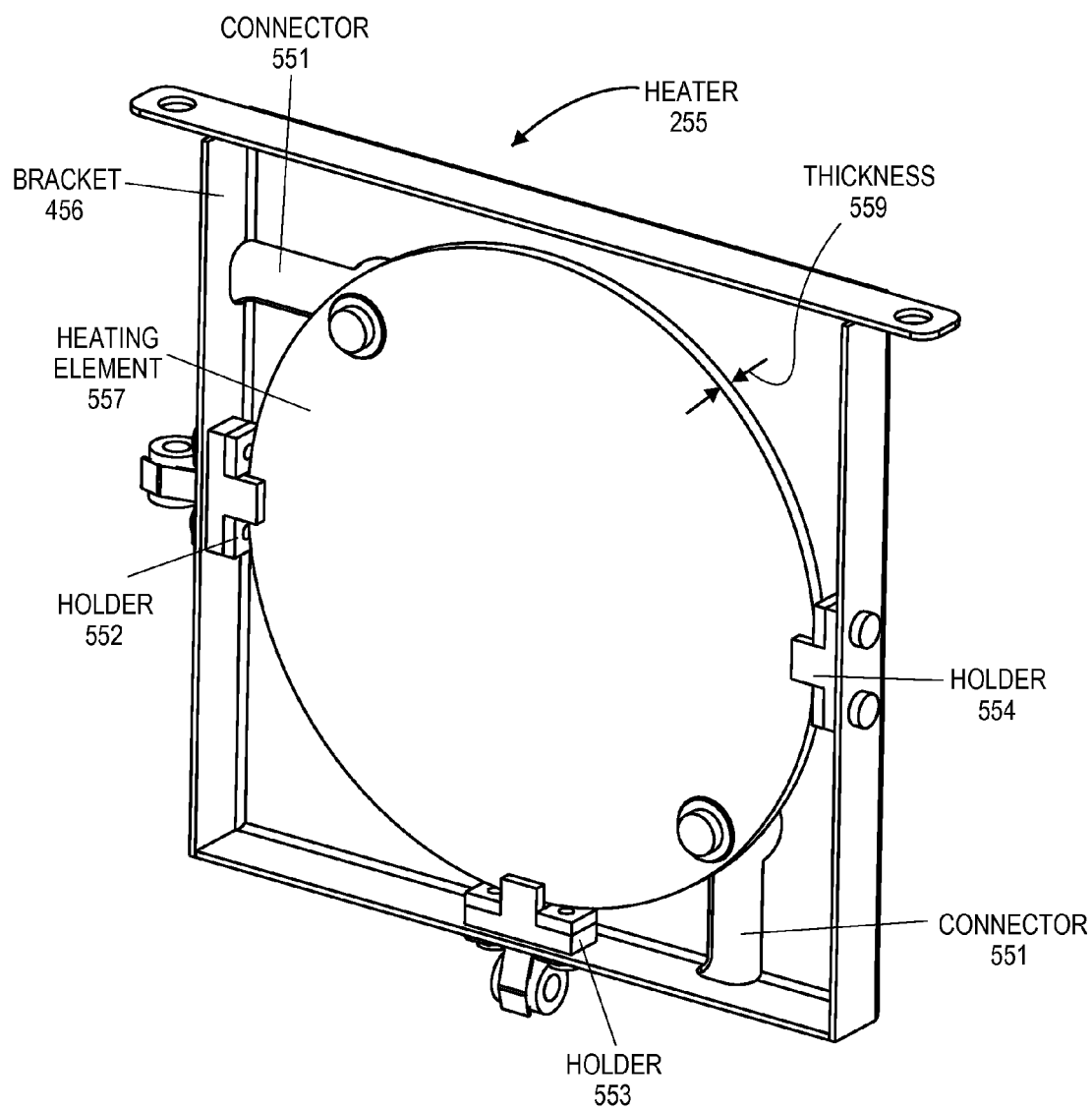
FIG. 5 illustrates a heater, according to one embodiment of the present invention.

FIG. 5 illustrates a heater, according to one embodiment of the present invention. In this embodiment, heater 255 includes a bracket 456 configured to be mounted (e.g., with bolts, nuts, screws, etc.) to cover 285 of the load chamber 250. In alternative embodiments, the bracket 456 may be mounted to other sections of the load chamber 250, for example, the side wall 251 shown in FIG. 4. The bracket 456 is constructed from a high heat resistant material such as titanium. In the embodiment illustrated in FIG. 4, the heating element 557 is secured within the bracket 456 with three holders 552-554. Electrical connection is made to the heating element with connectors 551. In this embodiment, the heating element 557 is a pyrolytic boron nitride heating element with a thickness 559 being less than 1 inch (with the bracket 456 corresponding sized) in order to fit within the preexisting space in the current Intevac MDP-250B disk sputtering system between the side wall 251 and the disk 235 when positioned by the load arm assembly 310 in the unload position above the unload slot 352. In alternative embodiments, the heater 255 may have other types of heating elements, for example, an infrared heating element and other dimensions.

Figure 6:
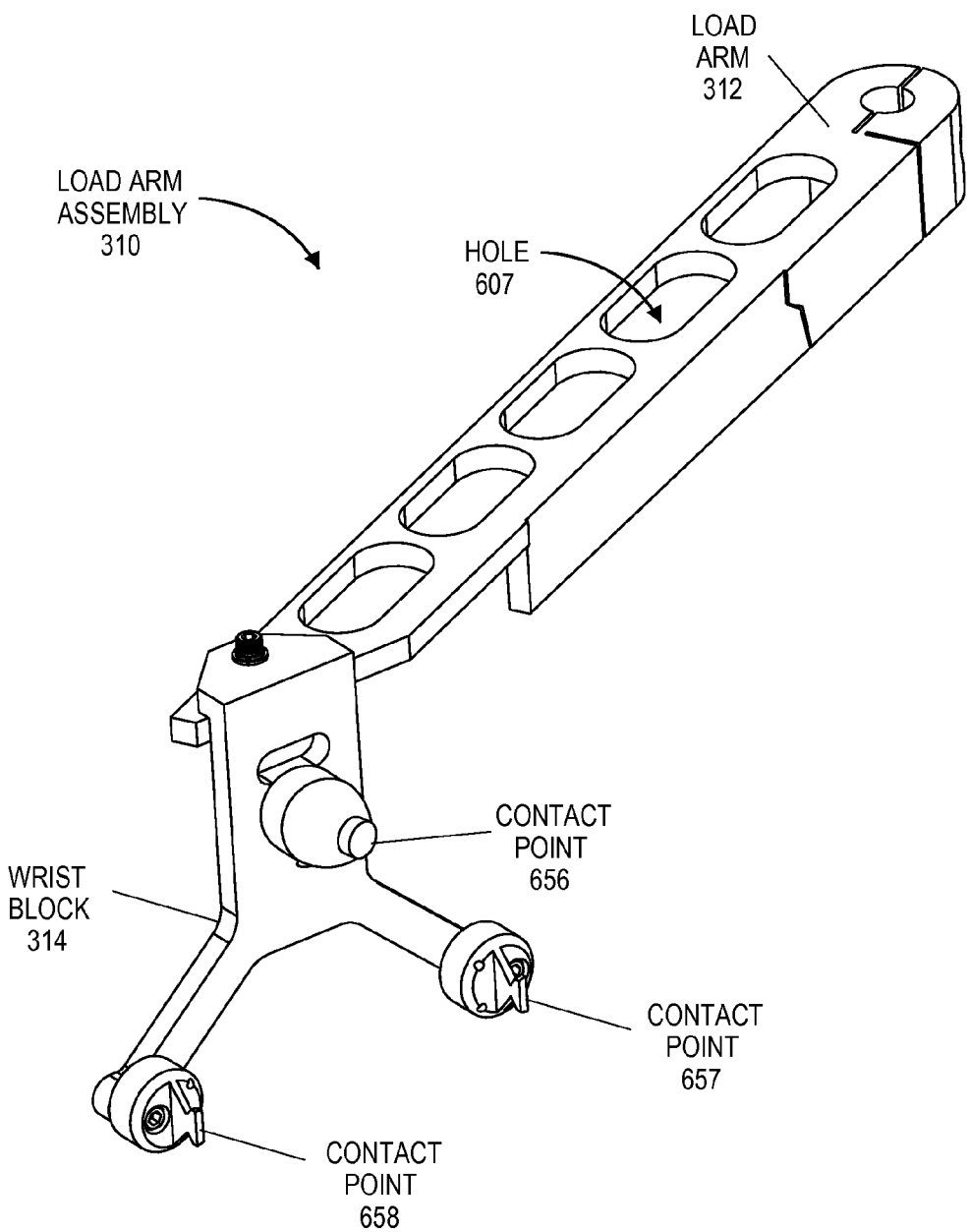
FIG. 6 illustrates one embodiment of a load arm assembly used in a load chamber with a heater.

FIG. 6 illustrates one embodiment of a load arm assembly used in a load chamber with a heater. In this embodiment, the load arm assembly 310 is composed of a load arm 312 coupled to a wrist block 314. The wrist block 314 has a plurality of disk contact points 656-658 to secure a disk 235 when loaded thereon. In one embodiment, the load arm 312 and wrist block 314 may be constructed from a nickel steel alloy, such as, for example, Invar™ (also known generically as 64FeNi and FeNi). Invar has a lower temperature coefficient of expansion and thus may be more thermally stable than other materials. In alternative embodiments, the load arm 312 and wrist block 314 may be constructed from other high temperature resistant materials such as, for example, titanium, aluminum and stainless steel. In one embodiment, the contact points 656-658 are constructed from ceramic. Alternatively, other materials may be used for the contact points 656-658. As illustrated in FIG. 6, the load arm 312 may have holes (e.g., hole 607) in order to reduce the weight of the load arm 312.

Figure 7:
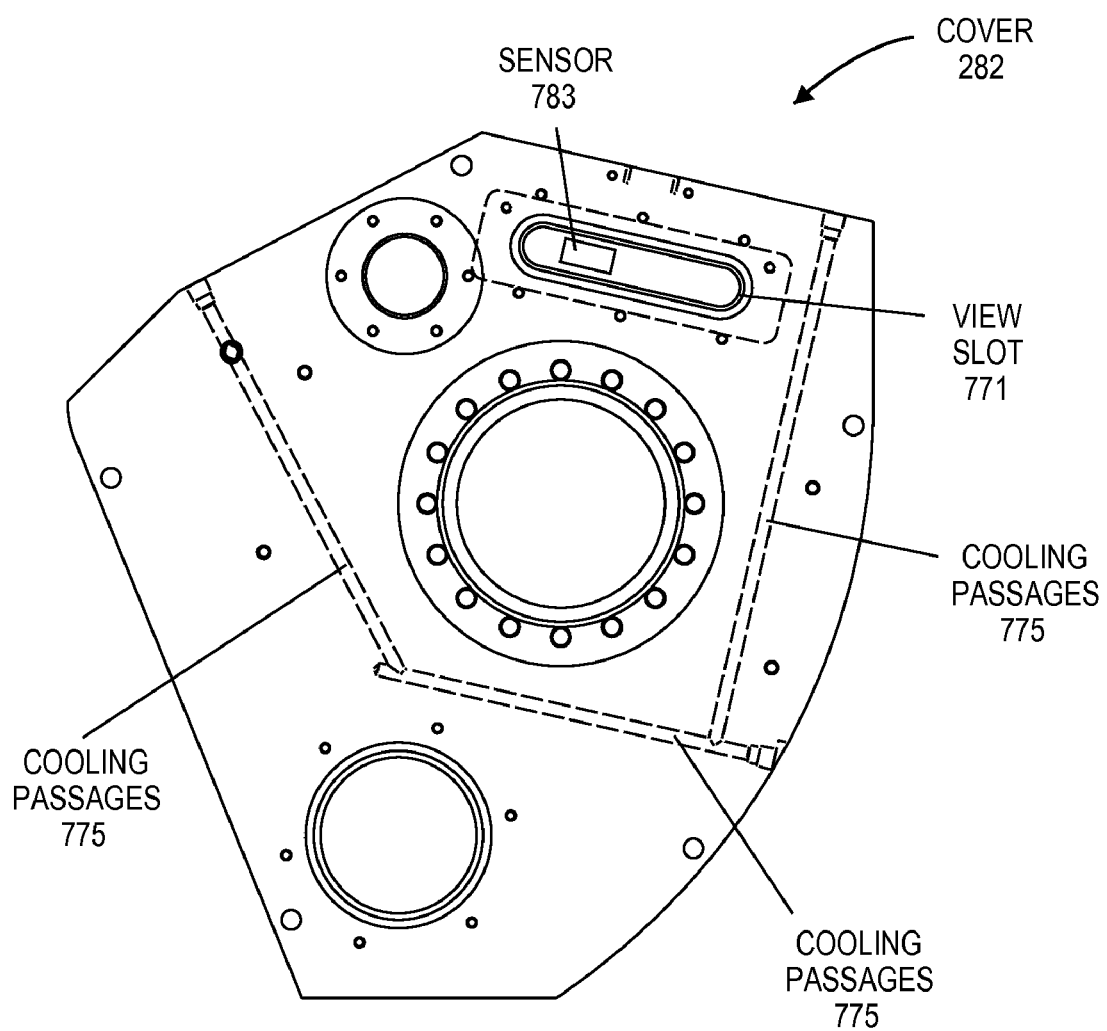
FIG. 7 is a top view illustrating one embodiment of a load chamber cover.

FIG. 7 is a top view illustrating one embodiment of a load chamber cover. In this embodiment, the cover 285 includes cooling passages 775 of a cooling assembly. A cooling fluid such as water is passed through the cooling passages 775 in order to assist with maintaining the load chamber 250 at a desired temperature. The cooling fluid may be received from a cooling fluid source as is used to supply other processing chambers using a compressors and pumps through manifolds and hoses. The supply of cooling fluid to a chamber is known in the art; accordingly, further details are not provided herein. In one exemplary embodiment, water is flowed through the cooling passages 775 at a rate of approximately 4.0 liters per minute and at a temperature in approximately a range of 60 to 65 degrees F.

In one embodiment, a disk presence sensor 783 is coupled to the top of the cover 285, above a view slot 771, and oriented towards a side edge of the disk 235 when the disk 235 is secured in the load arm assembly 310 in order to detect the presence of the disk 235 when adjacent to the heater 255 above the unload slot 352. In one embodiment, the sensor 783 is an LV-H47 Keyence sensor. Alternatively, other types of presence sensors may be used.

FIG. 8 is an exploded view illustrating one embodiment of a load chamber in relation to a lift arm. FIG. 8 shows the main housing of load chamber 250 in relation to the load chamber cover 285 and the unload blade 852. In this figure, the heater 255 can be seen mounted to the cover 285 and the unload blade 852 can be seen unloading disk 235.

In the foregoing specification, the present invention has been described with reference to specific exemplary embodiments thereof. It will, however, be evident that various modifications and changes may be made thereto without departing from the broader scope of the embodiments of the invention as set for in the appended claims. The specification and drawings are, accordingly, to be regarded in an illustrative rather than a restrictive sense.

What is claimed is:

1. A disk processing system, comprising:
   a plurality of processing chambers;
   a load chamber comprising a heater, wherein the load chamber has a side wall, wherein the heater is disposed adjacent to the side wall inside of the load chamber, and wherein the heater comprises a heating element having a thickness being less than 1 inch and capable of being electrically coupled to a power supply to provide a power great than 1.1 K Watts to heat a disk within the load chamber; and
   a disk transport system coupled to the plurality of processing chambers and the load chamber to transport the disk there among.

2. The system of claim 1, wherein the load chamber further comprises a cooling assembly.

3. The system of claim 2, wherein the cooling assembly comprises cooling passages disposed within a cover of the load chamber.

4. The system of claim 1, wherein the heater comprises a pyrolytic boron nitride heating element.

5. The system of claim 1, wherein the heater comprises an infrared heating element.

6. The system of claim 1, wherein the load chamber further comprises a load arm assembly comprising:
   a load arm;
   a wrist block coupled to the load arm; and
   a plurality of disk contact points coupled to the wrist block.

7. The system of claim 6, wherein the wrist block and the load are constructed from a material comprising at least one of titanium and nickel steel alloy.

8. The system of claim 6, wherein the disk contact points are constructed from a material comprising stainless steel.

9. The system of claim 6, wherein the disk contact points are constructed from a material comprising ceramic.

10. The system of claim 1, wherein the load chamber further comprises:
    a cover;
    a load arm assembly; and
    a disk presence sensor coupled to the cover of the load chamber and oriented towards a side edge of the disk when the disk is secured in the load arm.

11. The system of claim 1, wherein one of the plurality of process chambers comprises a heat chamber.

12. The system of claim 1, wherein the load chamber is further an unload chamber.

13. The system of claim 1, wherein the heater is coupled inside the load chamber using an attachment assembly comprising a bracket and a plurality of holders.

14. The system of claim 13, wherein the bracket is constructed from a material comprising titanium.

15. The system of claim 1, wherein one of the plurality of process chambers comprises a grain isolation sputter chamber.

16. The system of claim 1, wherein the plurality of processing chambers comprises 12 process chambers, and wherein none of the 12 process chambers comprise a heater.

17. The system of claim 1, wherein the load chamber has only a single heater.

18. The system of claim 1, where the power is approximately 2.5 K Watts.

* * * * *